United States Patent
Frye et al.

(10) Patent No.: US 7,759,208 B1
(45) Date of Patent: Jul. 20, 2010

(54) LOW TEMPERATURE ION IMPLANTATION FOR IMPROVED SILICIDE CONTACTS

(75) Inventors: Asa Frye, Lagrangeville, NY (US); Christian Lavoie, Pleasantville, NY (US); Ahmet S. Ozcan, Pleasantville, NY (US); Donald R. Wall, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/412,406

(22) Filed: Mar. 27, 2009

(51) Int. Cl.
*H01L 21/36* (2006.01)

(52) U.S. Cl. .................. 438/303; 438/305; 438/306; 438/528; 438/529; 438/660; 257/E21.003; 257/E21.324; 257/E21.334; 257/E21.337; 257/E21.592; 257/E29.084; 257/E29.086; 257/E29.193; 257/E29.266

(58) Field of Classification Search ......... 438/303–306, 438/514, 528, 529, 607, 659, 660; 257/E21.003, 257/324–337, 371, 592, E29.084, 86, 193, 257/206
See application file for complete search history.

(56) References Cited

U.S. PATENT DOCUMENTS

| | | | | |
|---|---|---|---|---|
| 4,351,695 A | * | 9/1982 | Hieber et al. | 117/9 |
| 5,244,820 A | * | 9/1993 | Kamata et al. | 438/514 |
| 5,323,031 A | * | 6/1994 | Shoji et al. | 257/198 |
| 5,602,045 A | * | 2/1997 | Kimura | 438/305 |
| 5,872,382 A | * | 2/1999 | Schwalke et al. | 257/408 |
| 6,060,403 A | * | 5/2000 | Yasuda et al. | 438/765 |
| 6,204,132 B1 | | 3/2001 | Kittl et al. | |
| 6,235,599 B1 | * | 5/2001 | Yu | 438/305 |
| 6,239,441 B1 | * | 5/2001 | Suguro et al. | 250/492.21 |
| 6,465,290 B1 | * | 10/2002 | Suguro et al. | 438/183 |
| 6,475,815 B1 | * | 11/2002 | Nambu et al. | 438/16 |
| 6,476,454 B2 | * | 11/2002 | Suguro | 257/410 |
| 7,148,131 B1 | * | 12/2006 | Suvkhanov et al. | 438/514 |

\* cited by examiner

*Primary Examiner*—Michael S Lebentritt
(74) *Attorney, Agent, or Firm*—Gibb I.P. Law Firm, LLC; Yuanmin Cai, Esq.

(57) ABSTRACT

Embodiments of the present invention provide a method that cools a substrate to a temperature below 10° C. and then implants ions into the substrate while the temperature of the substrate is below 10° C. The implanting causes damage to a first depth of the substrate to create an amorphized region in the substrate. The method forms a layer of metal on the substrate and heats the substrate until the metal reacts with the substrate and forms a silicide region within the amorphized region of the substrate. The depth of the silicide region is at least as deep as the first depth.

20 Claims, 5 Drawing Sheets

LOW TEMPERATURE ION IMPLANTATION FOR IMPROVED SILICIDE CONTACTS

BACKGROUND

1. Field of the Invention

Embodiments of the present invention generally relate to silicide formation process and, more specifically, to applying a low-temperature ion implantation process to the silicide formation process.

2. Description of the Related Art

Silicides are formed by depositing a layer of metal on top of conductive silicon and then heating the structure to allow the metal and silicon to combine into a silicide. Silicides are especially useful in reducing resistance of conductive silicon. Oftentimes, the silicon material to be a silicided is subjected to an ion treatment to create an amorphized region. However, the borders of this amorphized region can contain irregularities (end-of-range damage) that can be undesirably filled with the conductive metal, resulting in short circuits. For example, a room temperature 15 keV xenon ion implantation process would cause an amorphization depth of 160 A, but the damage would extend 275 A into the substrate, potentially leading to short circuits.

Further, previous amorphization ion implantation processes on SiGe cannot be readily integrated in device structures due to the observed degradation on P-type field effect transistors (PFETs) with eSiGe. The degradation of performance suggests that the stress in the channel regions induced by eSiGe is partially relaxed due to the damage caused by prior pre-amorphization ion implantation processes.

SUMMARY

Embodiments of the present invention address above issues. The disclosed embodiments involve shallow (smaller depth than the final silicide thickness) pre-amorphization of silicon germanium (SiGe) substrate using ion implantation (e.g., xenon or germanium). The energy and dose of ion implantation can be adjusted to amorphize a certain depth of the SiGe, which will be shallower than the SiGe consumed by the silicide. The embodiments herein perform a low temperature pre-amorphization ion implantation process at cold or low temperatures (e.g., <−30° C.) to minimize possible ion induced damage in SiGe and therefore avoid stress relaxation. The advantage of the low temperature pre-amorphization ion implantation process described above on SiGe comes from the fact that end-of-range damage is less compared to room temperature ion implantation. Therefore, the damage induced by this low temperature pre-amorphization ion implantation process described can be contained within the contact region more efficiently at low temperatures, minimizing the relaxation of the SiGe.

One exemplary embodiment of the method herein performs a low temperature pre-amorphization implantation (PAI) for improved silicide formation. More specifically, the method cools a substrate to a temperature below room temperature (e.g., below 10° C., below 0° C., below −30° C., below −60° C., etc., the colder the better). Then, one embodiment implants ions into the substrate while the temperature of the substrate remains below room temperature.

The ion implantation causes damage to a first depth of the substrate and thereby creates an amorphized region of the substrate down to the first depth. After the damage has been inflicted by the ion implantation, one embodiment cleans the substrate, allows the substrate to return to a warmer temperature, and forms a layer of metal on the substrate. The substrate is then heated (e.g., above 375° C.) until the metal reacts with the substrate to form a silicide region within the amorphized region of the substrate. The silicide is only formed within the amorphized region. The depth of the silicide region is at least equal to (and can be deeper than) the first depth in the substrate.

While this method can be used to silicide any silicon surface, in one specific example of siliciding transistor source and drain regions, the method forms a first impurity in a substrate to create channel regions. Gate stacks are formed above the channel regions. Then the method cools the substrate to a temperature below room temperature (e.g., below 10° C., below 0° C., below −30° C., below −60° C., etc.) and implants a second impurity into the substrate while the temperature of the substrate is below 10° C. The implanting of the impurities forms source and drain regions in the substrate adjacent the channel regions.

The substrate is then allowed to return to room temperature (or above). Then, the method forms a layer of metal such as nickel, nickel platinum or other nickel alloys, on the source and drain regions and heats the substrate until the nickel reacts with the substrate (e.g., above 375° C.) to form a nickel silicide region within the amorphized region of the substrate. Again, the nickel silicide is only formed within the amorphized region. Thus, the depth of the nickel silicide region is at least equal to (and can be deeper than) the first depth in the substrate. The second impurity can comprise any appropriate impurity including ions of germanium, xenon, boron, phosphorus, arsenic, etc. The substrate can comprise any appropriate silicon-based substrate, such as silicon germanium.

BRIEF DESCRIPTION OF THE DRAWINGS

The embodiments of the present invention will be better understood from the following detailed description with reference to the drawings, which are not necessarily drawing to scale and in which.

DETAILED DESCRIPTION

The embodiments herein and the various features and advantageous details thereof are explained more fully with reference to the non-limiting embodiments that are illustrated in the accompanying drawings and detailed in the following description.

Figure 1:
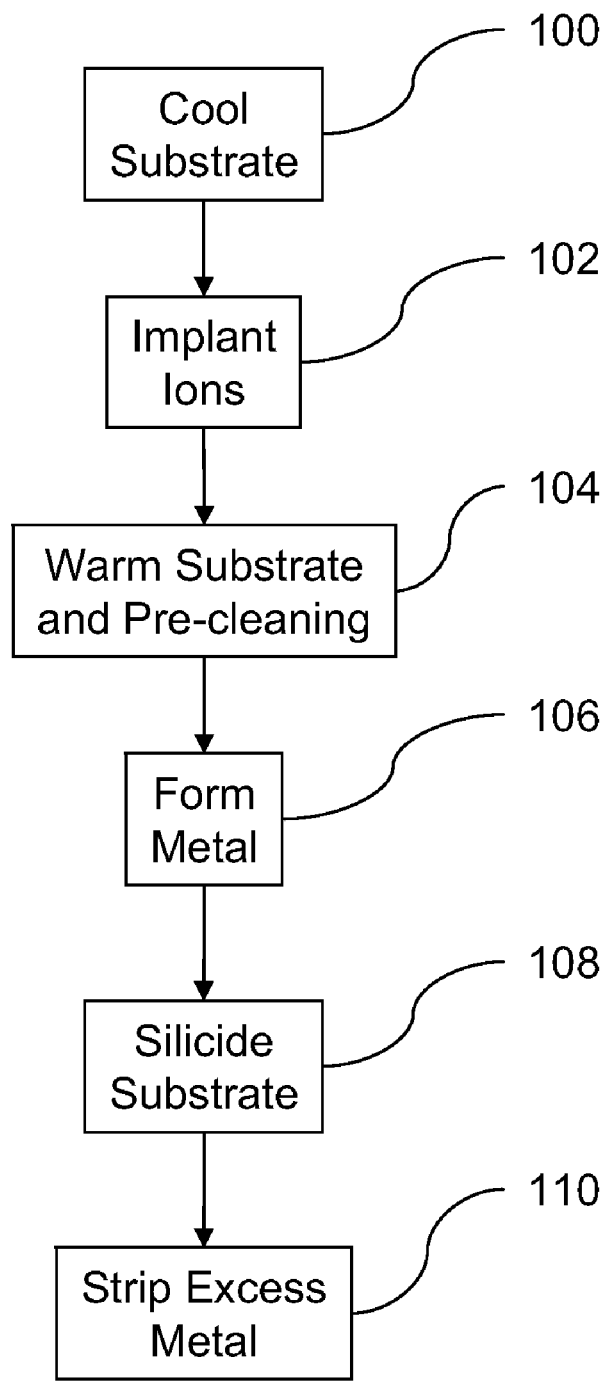
FIG. 1 is a flowchart illustrating one embodiment herein.
Figure 2:
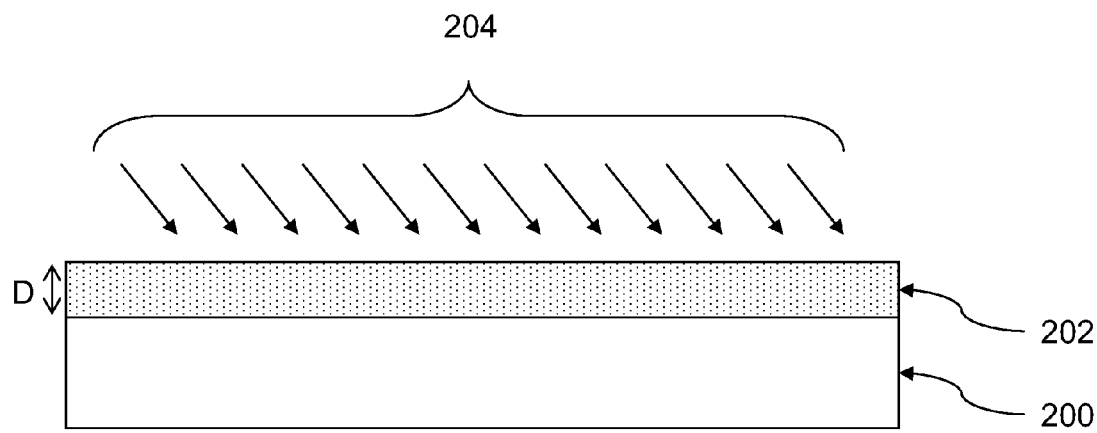
FIG. 2 is a schematic cross-sectional diagram of an integrated circuit structure illustrating a processing embodiment herein.

As shown in flowchart form in FIG. 1, one exemplary embodiment of the method herein performs a low temperature pre-amorphization ion implantation process (PAI) for improved silicide formation on a substrate. More specifically, in item 100, the method cools the substrate to a temperature below room temperature (e.g., below 10° C., below 0° C., below −30° C., below −60° C., etc., the colder the better). Then, in item 102, the method implants ions into the substrate while the temperature of the substrate is below room temperature. This is also shown in FIG. 2 where the ion implantation 204 causes damage to a first depth D of the substrate 200 and thereby creates an amorphized region 202 of the substrate 200 down to the first depth D. The substrate 200 can comprise any appropriate silicon-based substrate, such as silicon germanium.

Figure 3:
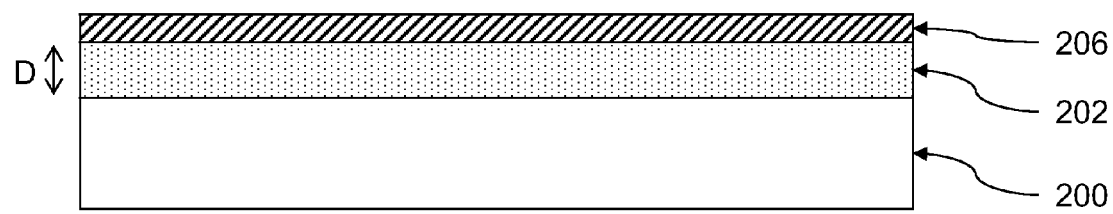
FIG. 3 is a schematic cross-sectional diagram of an integrated circuit structure illustrating a processing embodiment herein.
Figure 4:
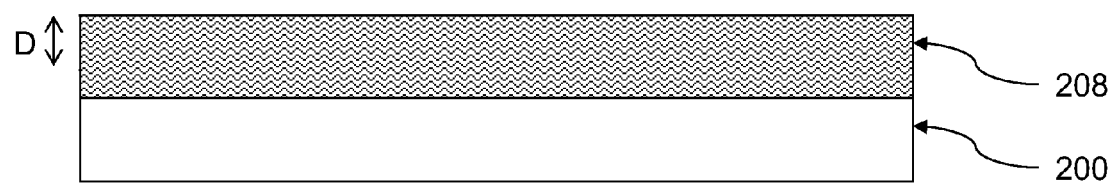
FIG. 4 is a schematic cross-sectional diagram of an integrated circuit structure illustrating a processing embodiment herein.

After the damage has been inflicted by the ion implantation, in item 104 the method allows the substrate to return to a warmer temperature. Optionally, a silicide pre-cleaning can be performed in item 104, if desired. In item 106, the method forms a layer of metal on the substrate. FIG. 3 illustrates the metal layer 206 formed on the substrate 200. The substrate is then heated (e.g., above 375° C.) until the metal layer reacts with the substrate to form a silicide region within the amorphized region of the substrate in item 108. Any excess metal is stripped in item 110. As shown in FIG. 4, the silicide 208 is formed within the previous amorphized region 202. The depth of the silicide region 208 is at least equal to (and can be deeper than) the first depth D in the substrate.

Figure 5:
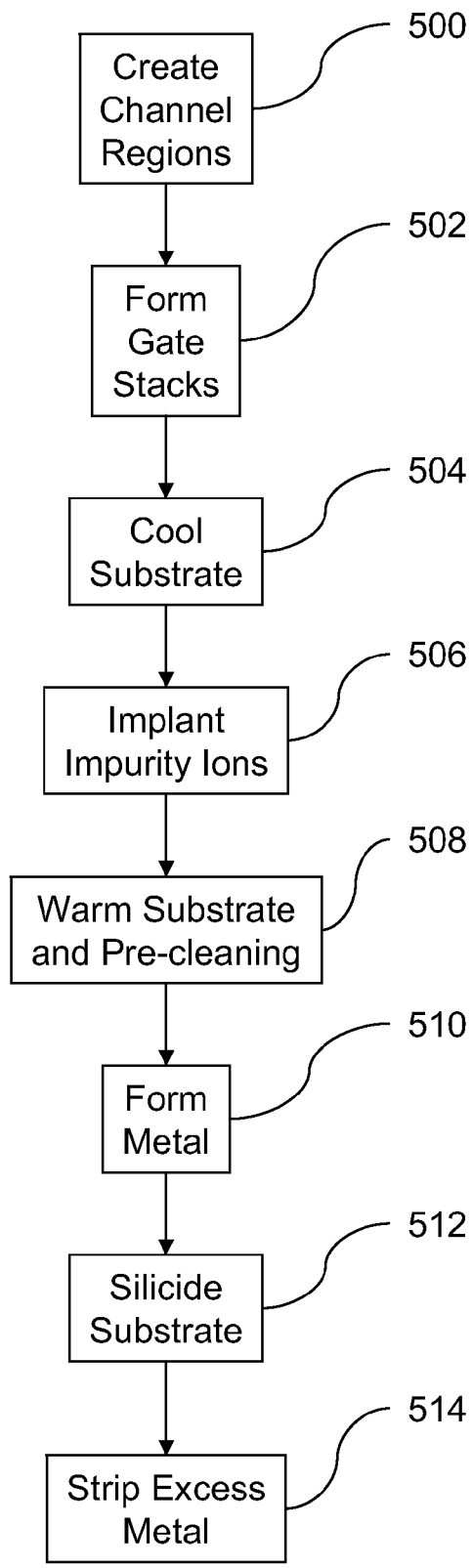
FIG. 5 is a flowchart illustrating one embodiment herein.
Figure 6:
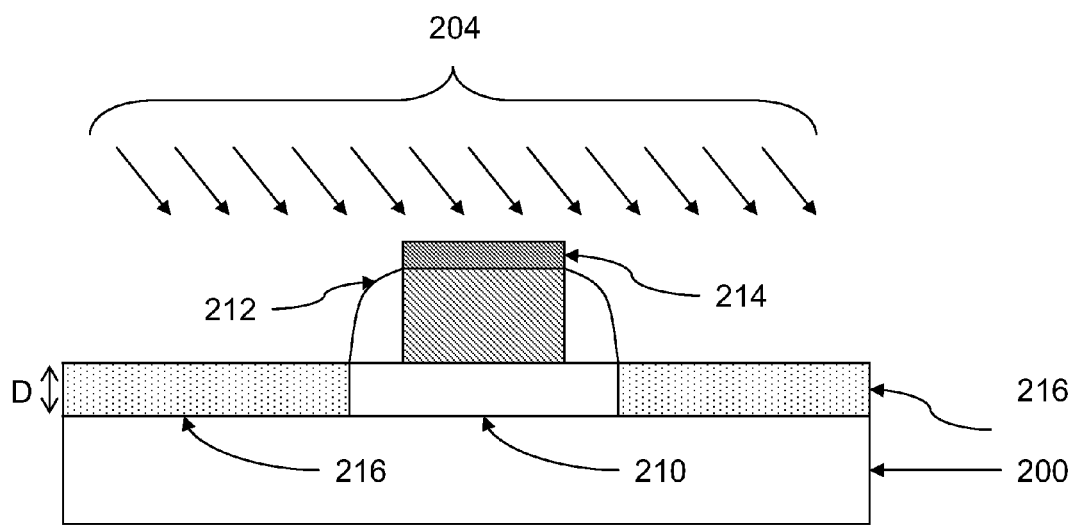
FIG. 6 is a schematic cross-sectional diagram of an integrated circuit structure illustrating a processing embodiment herein.

While this method can be used to silicide any silicon surface, in one specific example of siliciding transistor source and drain regions, as shown in flowchart form in FIG. 5, the method forms a first impurity in a substrate to create one or more channel regions in item 500. One or more gate stacks are formed above the channel regions in item 502. Then the method cools the substrate to a temperature below room temperature (e.g., below 10° C., below 0° C., below −30° C., below −60° C., etc., the colder the better) in item 504, and implants a second impurity into the substrate while the temperature of the substrate is below room temperature in item 506. This is shown in FIG. 6, where the substrate 200 now includes a channel region 210 and a gate stack 212. The gate stack 212 comprises a conductor. The conductor can comprise any form of conductor, including, metals and alloys, or can comprise any other conductor such as polysilicon, heavily doped silicon, etc. Spacers can border the gate stack and can comprise any appropriate material, including, insulators, oxides, nitrites, etc.

The ion implanting process 204 causes damage to the first depth D of the substrate 200 to create the amorphized region 202 in the substrate 200. If desired, a cap 214 can be utilized to protect the gate conductor during the ion implant process. The implanting of the impurities forms source and drain regions 216 in the substrate 200 adjacent the channel regions 210. The second impurity can comprise any appropriate impurity including ions of germanium, xenon, boron, phosphorus, arsenic, boron difluoride, etc.

Figure 7:
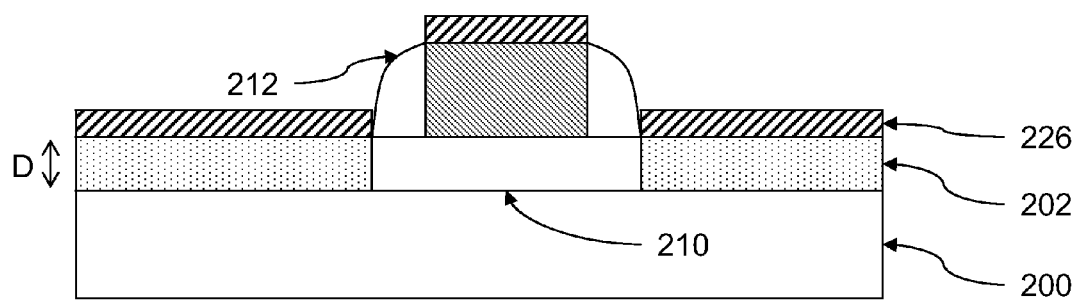
FIG. 7 is a schematic cross-sectional diagram of an integrated circuit structure illustrating a processing embodiment herein.
Figure 8:
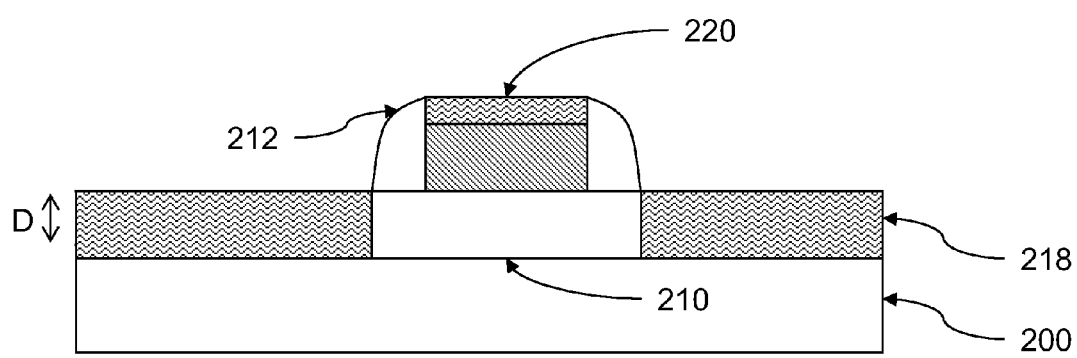
FIG. 8 is a schematic cross-sectional diagram of an integrated circuit structure illustrating a processing embodiment herein.

The substrate is then allowed to return to room temperature (or above) and an optional silicide pre-cleaning is performed in item 508. Then, the method forms a metal or a layer of metal such as nickel or a nickel alloy (e.g., platinum, palladium, rhodium, tantalum, titanium, tungsten, rhenium, etc.) on the source and drain regions in item 510. The layer of metal is shown as item 226 in FIG. 7. The method then heats the substrate until the nickel reacts with the substrate (e.g., above 375° C.) to form a nickel silicide region within the amorphized region of the substrate in item 512. Any excess metal is stripped in item 514. As shown in FIG. 8, the nickel silicide 218 is formed within the amorphized region 202. Thus, the depth of the nickel silicide region 218 is at least equal to (and can be deeper than) the first depth D in the substrate 200. In addition, if desired, the top of the gate stack 212 conductor can be silicided in the same process of forming silicide 220.

The embodiments herein perform the low temperature pre-amorphization ion implantation process described above at cold temperatures (<−30° C.) to minimize the ion induced damage in SiGe and therefore avoid stress relaxation. The advantage of the low temperature pre-amorphization ion implantation process described above on SiGe comes from the fact that end-of-range damage is less at lower temperatures when compared to room temperature ion implantation. Therefore, the damage induced by the low temperature pre-amorphization ion implantation process described above can be contained within the contact region more efficiently at low temperatures, minimizing the relaxation of the SiGe.

Figure 9:
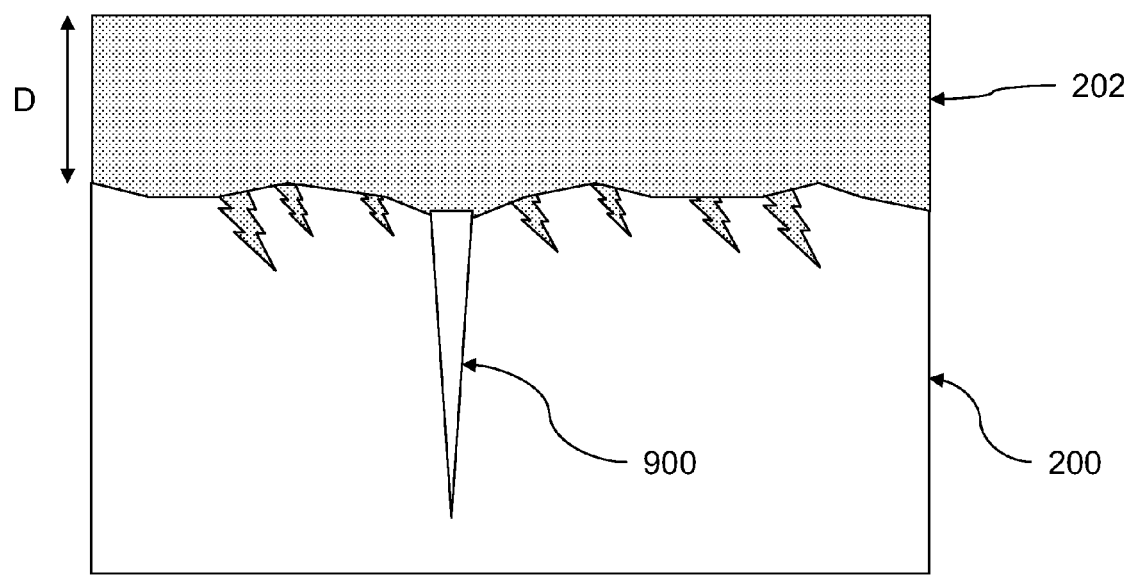
FIG. 9 is a schematic cross-sectional diagram of an integrated circuit structure illustrating a processing embodiment herein.

For example, FIG. 9 illustrates a more detailed view of the boundary between the amorphized region 202 and the substrate 200. When ions are implanted into a substrate, the substrate changes from morphous to amorphous. Any form of ion bombardment can be utilized. Therefore, the ions can be of the same material as a substrate, or the ions can be an impurity or dopant that is implanted into the substrate. An amorphous solid is a solid in which there is no long-range order of the positions of the atoms. (Solids in which there is long-range atomic order are called crystalline solids or morphous). Each individual ion produces many point defects in the target crystal on impact such as vacancies and interstitials. Vacancies are crystal lattice points unoccupied by an atom: in this case the ion collides with a target atom, resulting in transfer of a significant amount of energy to the target atom such that it leaves its crystal site.

Figure 10:
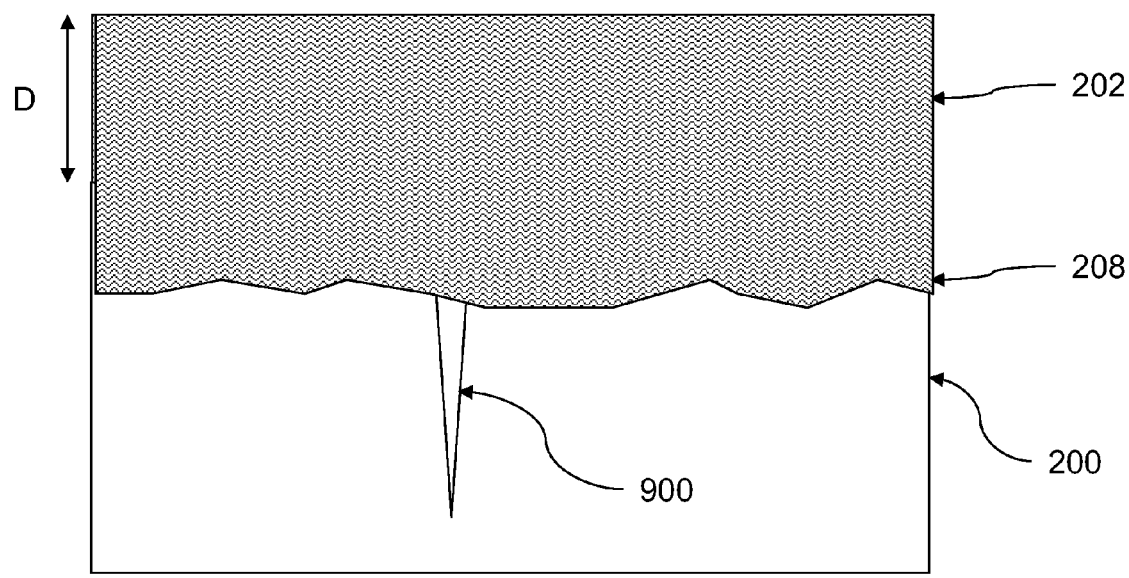
FIG. 10 is a schematic cross-sectional diagram of an integrated circuit structure illustrating a processing embodiment herein.

As shown in FIG. 9, the boundary between the amorphized region 202 and the substrate is not perfectly straight. Instead, there are irregularities that are referred to as end-of-range damage. Because the embodiments herein performed the ion implantation at low temperatures, the irregularities are relatively small. Contrast an irregularity 900 that would occur if the ion implantation were performed at room temperature or above. Note that irregularity 900 is not part of the illustrated structure, but is only included within FIGS. 9 and 10 to contrast the embodiments herein with conventional structures. In addition, because the embodiments form the silicide layer 208 to have a depth equal to or greater than the amorphized region 202 depth D, all the regularities are consumed and therefore do not create any forms of short-circuit (that might be created from the irregularity 900) that would be formed conventionally. Note that silicide layer 208 is illustrated in FIG. 10 in a somewhat transparent representation so that the relative depths of the amorphized region 202 and the silicide layer 208 can be compared.

Thus, the previously described embodiments utilize a low temperature ion implantation prior to forming metal silicides because conventional silicide formation techniques often result in short-circuits (e.g., item 900) and other undesirable consequences. For example, nickel silicide integration with SiGe can be challenging especially for higher germanium concentrations (>25% Ge). As shown in FIG. 10, silicide films (e.g., 208) may have a very rough interface or even have discontinuous structures depending on the thermal treatment.

In other words, the embodiments herein involve shallow (smaller depth than the final silicide thickness) pre-amorphization of the substrate using ion implantation (e.g. xenon or germanium). The energy and the dose of the ion implantation can be adjusted to amorphize a certain depth of the SiGe, which will be shallower than the SiGe consumed by the silicide. Xenon has a sharper amorphization boundary compared to germanium at a given energy. For example, a room temperature 15 keV xenon ion implantation process would cause an amorphization depth of 160 A, but the damage would extend 275 A into the substrate. To the contrary, by lowering the temperature to −30° C. during the ion implantation process, the damage can be reduced to less than 200 A. Thus, the low temperature pre-amorphization ion implantation process discussed above creates a much sharper boundary.

Previous amorphization ion implantation processes on SiGe cannot be readily integrated in device structures due to the observed degradation on P-type field effect transistors (PFETs) with eSiGe. The degradation of performance suggests that the stress in the channel regions induced by eSiGe is partially relaxed due to the damage caused by prior pre-amorphization ion implantation processes. The successful integration of the low temperature pre-amorphization ion implantation process described above improves nickel silicide because the damage caused by this low temperature pre-amorphization ion implantation process is contained in the silicided region and does not go deeper into SiGe. Therefore, the process disclosed herein does not relax the stress previously created in the PFET channel regions. As shown in FIGS. 9 and 10, this low temperature process achieves an amortization boundary that is very sharp with minimum straggle and the end-of-range damage is shallow.

Another integration challenge relates to post NiSi metal strip steps (110 and 514) used to remove unreacted silicide metal. The process window for the silicide formation annealing and the wet metal strip can be quite narrow for silicide on SiGe due to attack of the metal strip chemistry on partially transformed silicide regions. The low temperature pre-amorphization ion implantation process described above significantly improves the interface roughness and the uniformity of the silicide if the amorphization depth is shallow enough that the silicidation consumes all of the amorphized substrate. This relates to the effect of the low temperature pre-amorphization ion implantation process described above on the silicide formation kinetics. With the low temperature pre-amorphization ion implantation process discussed above, the NiSi formation is completed at a lower temperature and more abruptly. The metal strip wet etch attacks the metal-rich phase grains, especially more efficiently for nickel silicide on SiGe. Defects caused by wet strip attack (aqua regia chemistry, for example in this case) are eliminated because of this change in the formation kinetics.

More specifically, nickel silicide pipe (or tunnel) encroachment defects (such as item 900) that cause source/drain leakage or shorting in the channel, are one of the main yield detractors for all technologies that utilize the material. Nickel silicide encroachment defects are primarily related to incoming defects, where nickel diffuses deeply. Nickel is a very fast diffuser (similar to Cu in Si) and will take advantage of any defects to diffuse deep in the silicon. These incursions also occur in many forms and they do typically follow the 111 planes of silicon. When the defect is relatively short (sometimes referred to as pipes) the silicide phase remains NiSi but not surprisingly, when the defect is very long (sometimes referred to as tunnels) it is formed of $NiSi_2$ instead of NiSi. This is very similar to what occurs with the spiking of cobalt silicide through junctions after the first formation anneal. As the nickel diffuses deeply in the Si, the $NiSi_2$ occupies a very similar volume as the silicon it consumes for its formation. As a result, only this phase can be buried deep into silicon along the 111 planes without generating very large stresses (at the formation temperature currently used in the industry). Note that when a wafer is rotated by 45 degrees, these incursions also rotate with the silicon. The formation of tunnel defects (more frequent on narrower arsenic doped transistors) is dependent on dopant doses and energy, crystalline quality of the incoming silicon. To reduce the defect density, it is important to control the quality of the incoming silicon.

The low temperature ion implantation reduces crystal defects and end of range damage (FIG. 9) and therefore prepares a more defect free surface for nickel silicidation. Hence, nickel silicide encroachment defects can be reduced or eliminated which originate from substrate defects. Nickel silicide encroachment defects (tunnels and pipes) can be observed on N-type field effect transistors (NFETs). The arsenic (As) energy and dose used in NFET source/drain implantation usually plays a major role in causing defects in the substrate. Therefore, the embodiments herein are highly useful in NFET source/drain implantation.

The foregoing processes can be used to manufacture integrated circuit chips. The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiments were chosen and described in order to best explain the principles of the embodiments herein and the practical application, and to enable others of ordinary skill in the art to understand the embodiments herein for various embodiments with various modifications as are suited to the particular use contemplated. Well-known components and processing techniques are omitted in the above-description so as to not unnecessarily obscure the embodiments of the embodiments herein.

Finally, it should also be understood that the terminology used in the above-description is for the purpose of describing particular embodiments only and is not intended to be limiting of the embodiments herein. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method comprising:
cooling a substrate to a temperature below 10° C.;
implanting ions into said substrate while said temperature of said substrate is below 10° C., said implanting causing damage to a first depth of said substrate to create an amorphized region in said substrate;
forming a layer of metal on said substrate; and
heating said substrate until said metal reacts with said substrate and forms a silicide region within said amorphized region of said substrate, the depth of said silicide region being at least as deep as said first depth.

2. The method according to claim 1, wherein said ions comprises at least one of germanium ions and xenon ions.

3. The method according to claim 1, wherein said substrate comprises silicon germanium.

4. The method according to claim 1, wherein said temperature is below −30° C.

5. The method according to claim 1, wherein said depth of said silicide region is deeper than said first depth.

6. A method comprising:
cooling a substrate to a temperature below 10° C.;
implanting ions into said substrate while said temperature of said substrate is below 10° C., said implanting causing damage to a first depth of said substrate to create an amorphized region in said substrate;
forming a layer of metal on said substrate, said metal comprising one of a nickel and a nickel alloy; and
heating said substrate until said nickel or nickel alloy reacts with said substrate and forms a silicide region within said amorphized region of said substrate, the depth of said silicide region being at least as deep as said first depth.

7. The method according to claim 6, wherein said nickel alloy comprises nickel and one of platinum, palladium, rhodium, tungsten, rhenium, tantalum, and titanium.

8. The method according to claim 6, wherein said ions comprises at least one of germanium ions and xenon ions.

9. The method according to claim 6, wherein said substrate comprises silicon germanium.

10. The method according to claim 6, wherein said temperature is below −30° C.

11. The method according to claim 6, wherein said depth of said silicide region is deeper than said first depth.

12. A method comprising:
forming a first impurity in a substrate to create channel regions;
forming gate stacks above said channel regions;
cooling said substrate to a temperature below 10° C.;
implanting a second impurity into said substrate while said temperature of said substrate is below 10° C., said implanting forming source and drain regions in said substrate adjacent said channel regions to create a doped region in said substrate;
forming a metal comprising one of a nickel and a nickel alloy on said source and drain regions; and
heating said substrate until said nickel or nickel alloy of said metal reacts with said substrate and forms a silicide region within said doped region of said substrate.

13. The method according to claim 12, wherein said second impurity comprises at least one of arsenic, boron, phosphorus, and boron difluoride.

14. The method according to claim 12, wherein said substrate comprises one of silicon and silicon germanium.

15. The method according to claim 12, wherein said temperature is below −30° C.

16. A method comprising:
forming a first impurity in a substrate to create a channel region;
forming a gate stack above said channel region;
cooling said substrate to a temperature below 10° C.;
implanting a second impurity into said substrate while said temperature of said substrate is below 10° C., said implanting causing damage to a first depth of said substrate to create an amorphized region in said substrate, said implanting forming source and drain regions in said substrate adjacent said channel region;
forming a layer of nickel on said source and drain regions;
heating said substrate until said nickel reacts with said substrate and forms a silicide region within said amorphized region of said substrate, the depth of said silicide region being at least as deep as said first depth.

17. The method according to claim 16, wherein said second impurity comprises at least one of germanium ions and xenon ions.

18. The method according to claim 16, wherein said substrate comprises silicon germanium.

19. The method according to claim 16, wherein said temperature is below −30° C.

20. The method according to claim 16, wherein said depth of said silicide region is deeper than said first depth.

* * * * *